US 12,117,690 B2
… Oct. 15, 2024

(54) LIGHT-EMITTING MODULE

(71) Applicant: NICHIA CORPORATION, Anan (JP)

(72) Inventors: Satoru Niimi, Itano-gun (JP); Ryuma Marume, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/331,559

(22) Filed: Jun. 8, 2023

(65) Prior Publication Data

US 2023/0400620 A1 Dec. 14, 2023

(30) Foreign Application Priority Data

Jun. 9, 2022 (JP) ................. 2022-093374

(51) Int. Cl.
  *G02F 1/13357* (2006.01)
  *F21V 8/00* (2006.01)
  *G02F 1/1335* (2006.01)

(52) U.S. Cl.
  CPC ..... *G02F 1/133603* (2013.01); *G02B 6/0021* (2013.01); *G02B 6/0036* (2013.01); *G02B 6/0068* (2013.01); *G02F 1/133524* (2013.01)

(58) Field of Classification Search
  CPC .............. G02B 6/0021; G02B 6/0036; G02F 1/133524; G02F 1/133603
  See application file for complete search history.

(56) References Cited

U.S. PATENT DOCUMENTS

| 2010/0103699 | A1 | 4/2010 | Gonda et al. |
| 2020/0209460 | A1* | 7/2020 | Achi ................. F21V 5/04 |
| 2021/0096291 | A1* | 4/2021 | Emura ............. G02B 6/0038 |
| 2021/0096427 | A1* | 4/2021 | Yagi ............... G02B 6/0036 |
| 2021/0247051 | A1 | 8/2021 | Nakabayashi et al. |
| 2021/0247052 | A1 | 8/2021 | Nakabayashi et al. |
| 2021/0247053 | A1 | 8/2021 | Nakabayashi et al. |
| 2022/0003915 | A1 | 1/2022 | Nakabayashi et al. |
| 2022/0066088 | A1 | 3/2022 | Emura et al. |
| 2022/0099880 | A1 | 3/2022 | Hashimoto |

FOREIGN PATENT DOCUMENTS

| JP | 2010103068 A | 5/2010 |
| JP | 2014061629 A | 4/2014 |
| JP | 2021125455 A | 8/2021 |
| JP | 2021125456 A | 8/2021 |
| JP | 2021125457 A | 8/2021 |
| JP | 2022012220 A | 1/2022 |
| JP | 2022041169 A | 3/2022 |
| JP | 2022041836 A | 3/2022 |
| JP | 2022056369 A | 4/2022 |

* cited by examiner

*Primary Examiner* — Keith G. Delahoussaye

(74) *Attorney, Agent, or Firm* — Hunton Andrews Kurth LLP

(57) ABSTRACT

A light-emitting module includes a light source unit, and a light guide member surrounding the light source unit in a plan view and including a first hole portion opening on a side of a first surface of the light guide member and a second hole portion and a third hole portion, the second hole portion and the third hole portion are aligned in a first direction, a depth of the first hole portion from the first surface is shallower than a depth of the second hole portion from the first surface and a depth of the third hole portion from the first surface, and in the plan view, a maximum length of the second hole portion in the first direction is longer than a maximum length of the second hole portion in a second direction orthogonal to the first direction.

20 Claims, 5 Drawing Sheets

LIGHT-EMITTING MODULE

CROSS-REFERENCE TO RELATED APPLICATION

This application claims priority to Japanese Patent Application No. 2022-093374, filed on Jun. 9, 2022, the disclosure of which is hereby incorporated by reference in its entirety.

BACKGROUND

An embodiment according to the present disclosure relates to a light-emitting module.

A light-emitting module obtained by combining a light-emitting element such as a light-emitting diode with a light guide member is widely used in, for example, a planar light source such as a backlight for a liquid crystal display. For example, Japanese Patent Publication No. 2022-056369 discloses a light-emitting module including a light source unit and a light guide member having a hole portion in which the light source unit is disposed.

SUMMARY

There is a demand for further improvement in the light extraction efficiency of a light-emitting module. An object of an embodiment according to the present disclosure is to provide a light-emitting module with improved light extraction efficiency.

According to an aspect of the present disclosure, a light-emitting module includes a light source unit, and a light guide member surrounding the light source unit in a plan view and including a first surface. The light guide member includes a first hole portion opening on a side of the first surface and a second hole portion and a third hole portion located on an inner side of the first hole portion in a plan view, the second hole portion and the third hole portion are aligned in a first direction, a depth of the first hole portion from the first surface is shallower than a depth of the second hole portion from the first surface and a depth of the third hole portion from the first surface, and in the plan view, a maximum length of the second hole portion in the first direction is longer than a maximum length of the second hole portion in a second direction orthogonal to the first direction.

A light-emitting module of an embodiment of the present disclosure can have improved light extraction efficiency.

BRIEF OF DESCRIPTION OF DRAWINGS

DESCRIPTION OF EMBODIMENTS

Embodiments will be described below with reference to the drawings. Note that the drawings schematically illustrate embodiments, and thus scales, intervals, positional relationships, or the like of members may be exaggerated, or illustration of some of the members may be omitted. In the present specification, a direction of an arrow on a Z axis is defined as an upward direction and a direction opposite to the direction of the arrow on the Z axis is defined as a downward direction. As a cross-sectional view, an end view illustrating only a cut surface may be illustrated.

In the following description, components having substantially the same function may be denoted by the same reference signs and a description thereof may be omitted. Further, terms indicating a specific direction or position (for example, "upper", "lower", and other terms including or related to those terms) may be used. However, these terms are used merely to make it easy to understand relative directions or positions in the referenced drawing. As long as the relative direction or position is the same as that described in the referenced drawing using the term such as "upper" or "lower", in drawings other than the drawings of the present disclosure, actual products, and the like, components need not be arranged in the same manner as that in the referenced drawing. In the present specification, "parallel" includes not only a case in which two straight lines, sides, surfaces, or the like do not intersect even if extended, but also a case in which two straight lines, sides, surfaces, or the like intersect such that an angle formed by the two straight lines, sides, surfaces, or the like is in a range of 10° or less. In the present specification, a positional relationship that expresses "on" or "above" includes a case in which an object is in contact and also a case in which an object is not in contact but located above.

EMBODIMENT

Figure 1:
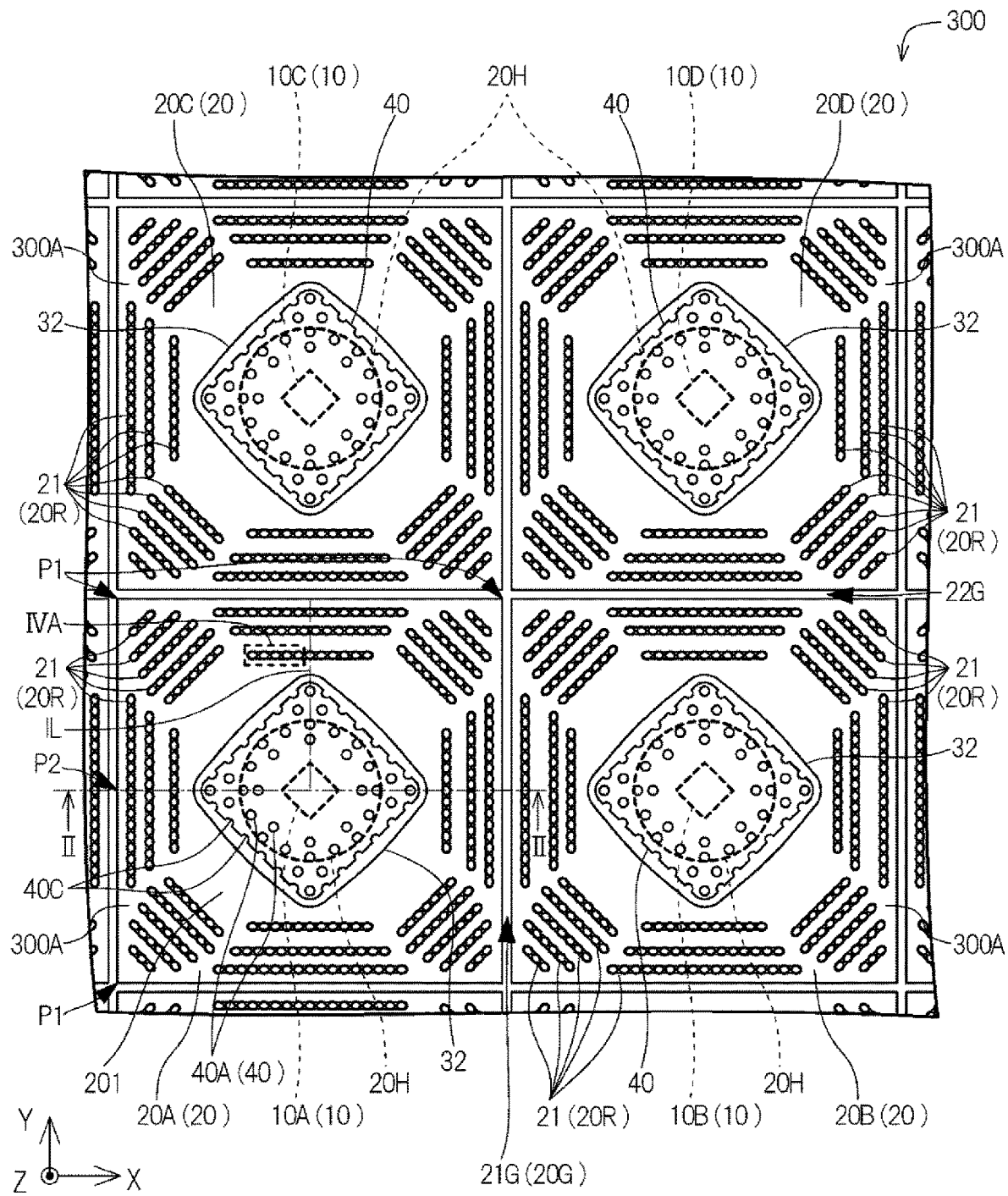
FIG. 1 is a schematic plan view of a planar light source according to an embodiment of the present disclosure.

A light-emitting module 100 and a planar light source 300 of an embodiment will now be described with reference to FIGS. 1 to 5. FIG. 1 is a schematic diagram of the planar light source 300 as seen from the light-emitting surface. As illustrated in FIG. 1, the two directions that are parallel to the light-emitting surface of the planar light source 300 and are orthogonal to each other are referred to as an X direction and a Y direction. The direction orthogonal to the X direction and the Y direction is referred to as a Z direction. In the present specification, the plane parallel to the X direction and the Y direction may be referred to as an XY plane. In addition, in the XY plane, the direction inclined from the X direction at an angle in a range from 0° to less than 360° may be referred to as the lateral direction, and the Z direction may be referred to as the vertical direction.

The planar light source 300 includes the light-emitting module 100 and a support member 200. The light-emitting module 100 is disposed on the support member 200. The light-emitting module 100 includes a light source unit 10 and a light guide member In a plan view, the light guide member 20 surrounds the light source unit 10. The light guide member 20 has a first surface 201 and a second surface 202 on the opposite side of the first surface 201. The light guide member 20 has a first hole portion 21 that opens on the first surface 201 side. The light guide member 20 has a second hole portion 22 and a third hole portion 23 both inward of the first hole portion 21 in a plan view. The second hole portion 22 and the third hole portion 23 are aligned in a first direction. The depth of the first hole portion 21 from the first surface 201 is shallower than the depth of the second hole portion 22 from the first surface 201. The depth of the first hole portion 21 from the first surface 201 is shallower than the depth of the third hole portion 23 from the first surface 201. In a plan view, the maximum length of the second hole portion 22 in the first direction is longer than the maximum length of the second hole portion 22 in a second direction orthogonal to the first direction. In the present specification, the first hole portion 21, the second hole portion 22, and/or the third hole portion 23 may be referred to as hole portions/portion 20R when not distinguishing therebetween.

Because the light guide member 20 includes the hole portions 20R that open on the first surface 201 side, the surface area of the light guide member 20 can be easily increased. In that case, light from the light source unit 10 incident on the light guide member 20 can be easily extracted to the outside of the light guide member 20. This can improve the light extraction efficiency of the light-emitting module 100.

Hereinafter, the elements constituting the light-emitting module 100 and the planar light source 300 will be described in detail.

Light Source Unit 10

As illustrated in FIG. 1, the light-emitting module 100 includes a plurality of the light source units 10 including a first light source 10A, a second light source 10B, a third light source 10C, and a fourth light source 10D. Note that the quantity of the light source units 10 included in the light-emitting module 100 may be one.

Figure 3A:
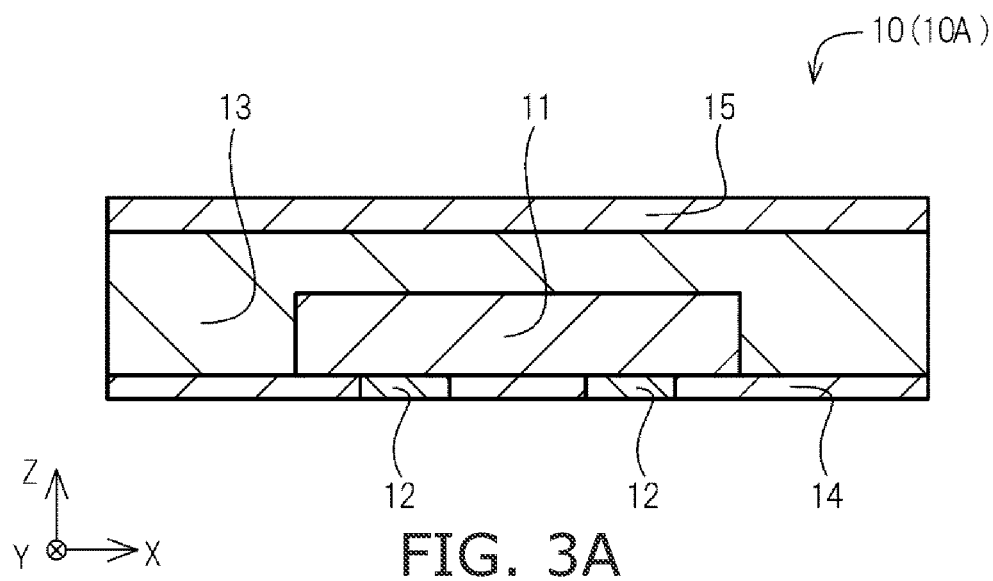
FIG. 3A is a schematic cross-sectional view of a light source unit according to the embodiment.

As illustrated in FIG. 3A, the light source unit 10 includes a light-emitting element 11. The light-emitting element 11 includes a semiconductor layered body. The semiconductor layered body includes, for example, a substrate of sapphire, gallium nitride, or the like; and an n-type semiconductor layer; a p-type semiconductor layer disposed on the substrate; and a light-emitting layer interposed between the n-type semiconductor layer and the p-type semiconductor layer. The light-emitting element 11 includes an n-side electrode electrically connected to the n-type semiconductor layer and a p-side electrode electrically connected to the p-type semiconductor layer. The n-side electrode and the p-side electrode are included in portions of a lower surface of the light-emitting element 11. The light source unit 10 includes a pair of positive and negative electrodes 12. The pair of positive and negative electrodes 12 are included in portions of a lower surface of the light source unit 10. One of the pair of electrodes 12 is electrically connected to the p-side electrode, and the other is electrically connected to the n-side electrode. Note that the light source unit 10 need not include the electrodes 12. When the light source unit 10 does not include the pair of positive and negative electrodes 12, the n-side electrode and the p-side electrode of the light-emitting element 11 are included in portions a part of the lower surface of the light source unit 10. The light source unit 10 need not include a substrate of sapphire, gallium nitride, or the like. This can make it easier to downsize the light source unit 10 in the vertical direction.

The structure of the light-emitting layer may be a structure including a single active layer such as a double heterostructure and a single quantum well (SQW) structure, or a structure including a group of active layers such as a multiple quantum well (MQW) structure. The light-emitting layer can emit visible light or ultraviolet light. The light-emitting layer can emit light, as visible light, from blue light to red light. As the semiconductor layered body including the light-emitting layer, for example, $In_xAl_yGa_{1-x-y}N$ ($0 \leq x$, $0 \leq y$, $x+y \leq 1$) can be included. The semiconductor layered body can include at least one light-emitting layer that can achieve the light emission described above. For example, the semiconductor layered body may have a structure including one or more light-emitting layers between the n-type semiconductor layer and the p-type semiconductor layer, or may have a structure in which a structure including the n-type semiconductor layer, the light-emitting layer, and the p-type semiconductor layer in order is repeated multiple times. When the semiconductor layered body includes the plurality of light-emitting layers, the semiconductor layered body may include the light-emitting layers having different light emission peak wavelengths, or may include the light-emitting layers having the same light emission peak wavelength. Note that the light emission peak wavelength being the same means that there may be a variation of approximately several nm, for example. A combination of such light-emitting layers can be selected as appropriate, and, for example, when the semiconductor layered body includes two light-emitting layers, the light-emitting layers can be selected from combinations of blue light and blue light, green light and green light, red light and red light, ultraviolet light and ultraviolet light, blue light and green light, blue light and red light, green light and red light, and the like. The light-emitting layer may include a plurality of active layers having different light emission peak wavelengths, or may include a plurality of active layers having the same light emission peak wavelength.

As illustrated in FIG. 3A, the light source unit 10 includes the single light-emitting element 11. Each light source unit 10, that is, the first light source 10A, the second light source 10B, the third light source 10C, and the fourth light source 10D, may include a plurality of light-emitting elements 11. The light emission peak wavelengths of the plurality of light-emitting elements included in each light source unit 10 may be the same or different. For example, in a case in which each light source unit 10 includes two light-emitting elements, the light emission peak wavelengths of the light-emitting elements can be selected to have combinations such as blue light and green light, blue light and red light, ultraviolet light and blue light, ultraviolet light and green light, ultraviolet light and red light, green light and red light, or the like. For example, in a case in which each light source unit 10 includes three light-emitting elements, the light emission peak wavelengths of the light-emitting elements can be selected to have combinations such as blue light, green light, and red light; ultraviolet light, green light, and red light; ultraviolet light, blue light, and green light; ultraviolet light, blue light, and red light; ultraviolet light, green light, and red light; or the like.

As illustrated in FIG. 3A, the light source unit 10 may further include a light-transmissive member 13 (hereinafter, referred to as a light source light-transmissive member). The light source light-transmissive member 13 covers an upper surface and lateral surfaces of the light-emitting element 11. The light-emitting element 11 can be protected by the light source light-transmissive member 13. The light source light-transmissive member 13 may be disposed exposing at least a part of the upper surface of the light-emitting element 11. This can make it easier to downsize the light source unit 10 in the vertical direction.

For example, the light source light-transmissive member 13 has light transmissivity to light emitted by the light-emitting element 11. The light source light-transmissive member 13 contains a light-transmissive resin, and may further contain a phosphor. Examples of the light-transmissive resin that can be used include a silicone resin and an epoxy resin. Also, examples of the phosphor that can be used include an yttrium aluminum garnet based phosphor (for example, $(Y,Gd)_3(Al,Ga)_5O_{12}:Ce$), a lutetium aluminum garnet based phosphor (for example, $Lu_3(Al,Ga)_5O_{12}:Ce$), a terbium aluminum garnet based phosphor (for example, $Tb_3(Al,Ga)_5O_{12}$:Ce), a CCA based phosphor (for example, $Ca_{10}(PO_4)_6Cl_2$:Eu), an SAE based phosphor (for example, $Sr_4Al_{14}O_{25}$:Eu), a chlorosilicate based phosphor (for example, $Ca_8MgSi_4O_{16}Cl_2$:Eu), a silicate based phosphor (for example,) $Ba,Sr,Ca,Mg)_2SiO_4$:Eu), an oxynitride based phosphor such as a β-SiAlON based phosphor (for example, $(Si,Al)_3(O,N)_4$:Eu), or an α-SiAlON based phosphor (for example, $Ca(Si,Al)_{12}(O,N)_{16}$:Eu), a nitride based phosphor such as an LSN based phosphor (for example, $(La,Y)_3Si_6N_{11}$:Ce), a BSESN based phosphor (for example, $(Ba,Sr)_2Si_5N_8$:Eu), an SLA based phosphor (for example, $SrLiAl_3N_4$:Eu), a CASN based phosphor (for example, $CaAlSiN_3$:Eu), or an SCASN based phosphor (for example, $(Sr,Ca)AlSiN_3$:Eu), a fluoride based phosphor such as a KSF based phosphor (for example, $K_2SiF_6$:Mn), a KSAF based phosphor (for example, $K_2(Si_{1-x}Al_x)F_{6-x}$:Mn, wherein x satisfies 0<x<1), or an MGF based phosphor (for example, $3.5MgO \cdot 0.5MgF_2 \cdot GeO_2$:Mn), a quantum dot phosphor having a perovskite structure (for example, $(Cs,FA,MA)(Pb,Sn)(F,Cl,Br,I)_3$, where FA and MA represent formamidinium and methylammonium, respectively), a Group II-VI quantum dot phosphor (for example, CdSe), a Group III-V quantum dot phosphor (for example, InP), and a quantum dot phosphor having a chalcopyrite structure (for example, $(Ag,Cu)(In,Ga),(S,Se)_2$). As the phosphor added to the light source light-transmissive member 13, one type of phosphor may be used, or a plurality of types of phosphors may be used.

Further, a wavelength conversion sheet containing the phosphor described above may be disposed on the planar light source 300. Using the wavelength conversion sheet that absorbs a part of the blue light from the light source unit 10 and emits yellow light, green light, and/or red light, the planar light source emitting white light can be obtained. For example, the light source unit 10 that can emit blue light and the wavelength conversion sheet containing a phosphor that can emit yellow light can be combined to produce white light. Alternatively, the light source unit 10 that can emit blue light and the wavelength conversion sheet containing a red phosphor and a green phosphor may be combined. Further, the light source unit 10 that can emit blue light and a plurality of the wavelength conversion sheets may be combined. An example of the plurality of wavelength conversion sheets that can be selected includes a combination of the wavelength conversion sheet containing the phosphor that can emit red light and the wavelength conversion sheet containing the phosphor that can emit green light. Further, the light source unit 10 including the light-emitting element 11 that can emit blue light and the light source light-transmissive member 13 containing a phosphor that can emit red light, and a wavelength conversion sheet containing a phosphor that can emit green light may be combined.

As a phosphor that can emit yellow light used in the wavelength conversion sheet, the yttrium aluminum garnet based phosphor is preferably used, for example. Further, as a phosphor that can emit green light used in the wavelength conversion sheet, a phosphor having a narrow half-value width of a light emission peak wavelength is preferably used, for example, the quantum dot phosphor having the perovskite structure, the Group III-V quantum dot phosphor, or the quantum dot phosphor having the chalcopyrite structure described above. Further, as a phosphor that can emit red light used in the wavelength conversion sheet, a phosphor having a narrow half-value width of a light emission peak wavelength is preferably used, for example, the KSF based phosphor, the KSAF based phosphor, the Group III-V quantum dot phosphor, or the quantum dot phosphor having the chalcopyrite structure described above, like the phosphor that can emit green light.

The light source unit 10 may further include a covering member 14. The covering member 14 is disposed on a lower surface of the light-emitting element 11. The covering member 14 is disposed so that lower surfaces of the electrodes 12 of the light source unit 10 are exposed from the covering member 14. The covering member 14 is also disposed on a lower surface of the light source light-transmissive member 13 covering the lateral surfaces of the light-emitting element 11.

The covering member 14 has reflectivity to the light emitted by the light-emitting element 11. The covering member 14 can include, for example, a resin member containing a gas such as nitrogen or oxygen, a resin member containing light-scattering particles, or the like can be used. As a resin member of the covering member 14, a thermoplastic resin such as an acrylic resin, a polycarbonate resin, a cyclic polyolefin resin, a polyethylene terephthalate resin, or a polyester resin, or a thermosetting resin such as an epoxy resin or a silicone resin can be used, for example. Examples of the light-scattering particles of the covering member 14 that can be used include particles of titania, silica, alumina, zinc oxide, magnesium oxide, zirconia, yttria, calcium fluoride, magnesium fluoride, niobium pentoxide, barium titanate, tantalum pentoxide, barium sulfate, glass, or the like. The covering member 14 may contain both the gas and the light-scattering particles.

As illustrated in FIG. 3A, the light source unit 10 may include a light adjustment member 15 (hereinafter, referred to as a light source light adjustment member). The light source light adjustment member 15 is included in at least a part of an upper surface of the light source unit 10. The light source light adjustment member 15 is disposed above the light-emitting element 11. The light source light adjustment member 15 and the light-emitting element 11 overlap in a plan view, and, at the overlapped portion, the light source light adjustment member 15 is disposed above the light-emitting element 11. The light source light adjustment member 15 is disposed above the light source light-transmissive member 13, and adjusts an amount and/or an emission direction of light emitted from an upper surface of the light source light-transmissive member 13. The light source light adjustment member 15 has reflectivity and light transmissivity to light emitted by the light-emitting element 11. A part of the light emitted from the upper surface of the light source light-transmissive member 13 is reflected by the light source light adjustment member 15, and the other part is transmitted through the light source light adjustment member 15. A transmittance of the light source light adjustment member 15 with respect to a peak wavelength of the light-emitting element 11 is, preferably in a range from 1% to 50%, more preferably in a range from 3% to 30%, for example. Because the light source unit 10 includes the light source light adjustment member 15, a region directly above the light source unit 10 can be prevented from too bright. This can make it possible to reduce luminance unevenness in the light-emitting module 100.

The light source light adjustment member 15, for example, can be formed using a resin member containing light-scattering particles. A material similar to that of the resin member of the covering member 14 can be used for the resin member of the light source light adjustment member 15. A material similar to that of the light-scattering particles of the covering member 14 can be used for the light-scattering particles of the light source light adjustment member 15. The light source light adjustment member 15 may be, for example, a metal member such as aluminum or silver, or a dielectric multilayer film.

Figure 3B:
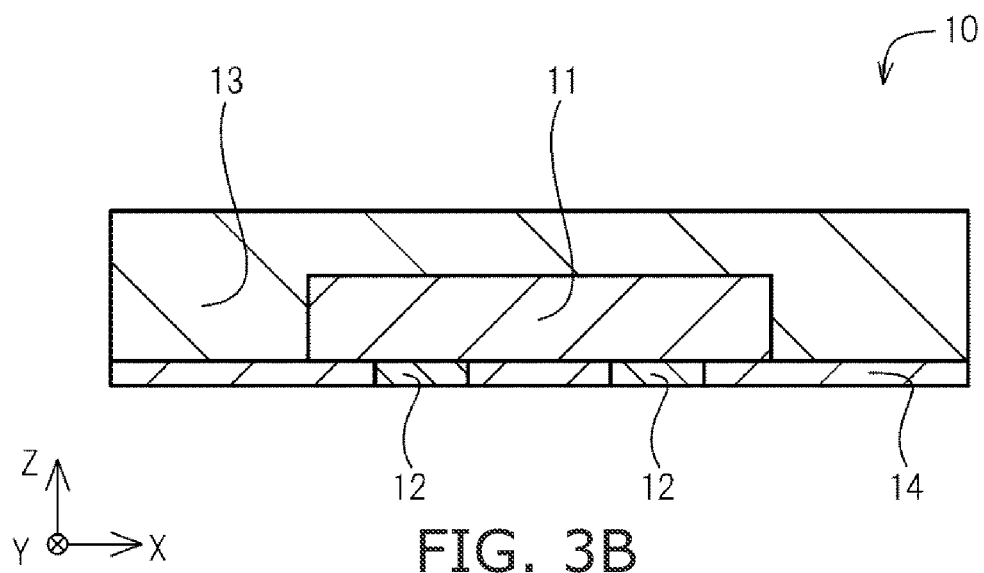
FIG. 3B is a schematic cross-sectional view of a modification of the light source unit according to the embodiment.

As illustrated in FIG. 3B, the light source unit 10 need not include the light source light adjustment member 15. This can make it easier to downsize the light source unit 10 in the vertical direction than when the light source unit 10 includes the light source light adjustment member 15 disposed above the light-emitting element 11. In another form, the light source unit 10 need not include the covering member 14. For example, a lower surface of the light source unit may include the lower surface of the light-emitting element, the lower surfaces of the pair of electrodes 12, and the lower surface of the light source light-transmissive member. In another form, the light source unit 10 may be only a light-emitting element 11 alone. In another form, the light source unit 10 need not include the covering member 14 and the light source light-transmissive member 13, and may include the light source light adjustment member 15 disposed on the upper surface of the light-emitting element 11. In another form, the light source unit 10 need not include the light source light-transmissive member 13, and may include the light source light adjustment member 15 disposed on the upper surface of the light-emitting element 11 and the covering member 14 disposed on the lower surface of the light-emitting element 11.

In a plan view, the shape of the light source unit 10 is not particularly limited. In a plan view, the light source unit 10 may have, for example, a shape such as a circular, triangular, quadrangular, hexagonal, or octagonal shape. In a plan view, when the shape of the light source unit 10 is quadrangular, a pair of outer edges of the light source unit 10 may be parallel to the X direction or at least one of the pair may be inclined with respect to the X direction. In the present embodiment, the pair of outer edges of the light source unit 10 are inclined at 45° with respect to the X direction.

Light Guide Member 20

Figure 2:
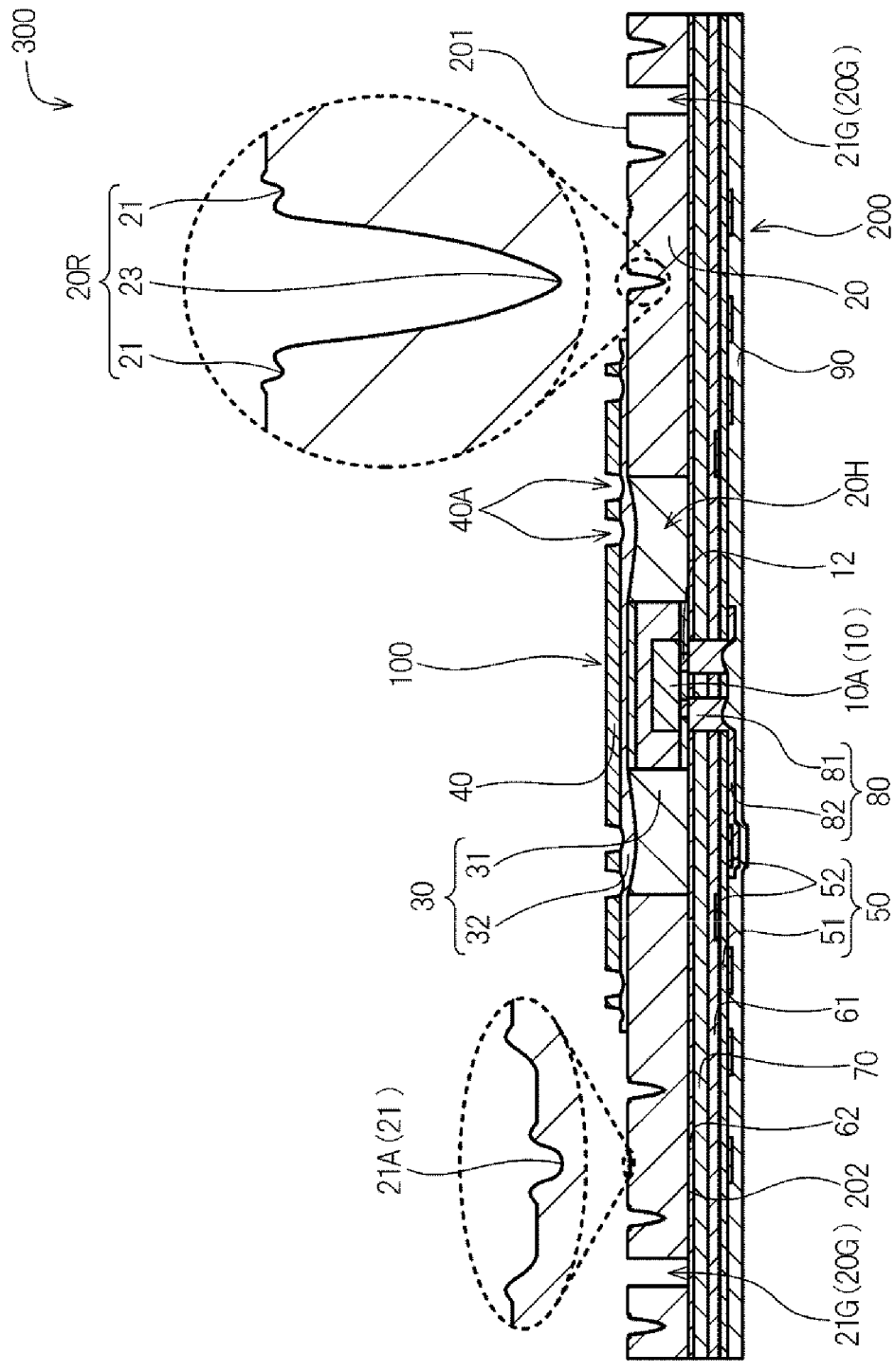
FIG. 2 is a schematic cross-sectional view taken along line II-II in FIG. 1.

The light guide member 20 is a member that has light transmissivity to light emitted by the light source unit 10. A transmittance of the light guide member 20 with respect to a peak wavelength of the light source unit 10 is preferably, for example, 60% or greater, more preferably 80% or greater. As illustrated in FIG. 2, the light guide member 20 has the first surface 201 serving as the light-emitting surface of the light-emitting module 100 and the second surface 202 located on the opposite side of the first surface 201. As illustrated in FIG. 1, the light guide member 20 continuously surrounds the light source unit 10 in a plan view. In the present embodiment, the light guide member 20 includes a housing portion 20H extending from the first surface 201 to the second surface 202. The light source unit 10 is disposed in the housing portion 20H of the light guide member 20. In the present embodiment, the housing portion 20H has a circular shape in a plan view. In a plan view, the housing portion 20H may be an ellipse or may have a polygonal shape such as a triangle, a quadrangle, a hexagon, or an octagon. Note that the housing portion 20H may be a recessed portion that opens only to the second surface 202 side of the light guide member 20. When the housing portion 20H is a recessed portion, the housing portion 20H has an upper surface defining the recessed portion of the light guide member 20. When the housing portion 20H is a recessed portion, the light guide member 20 includes a portion covering the upper surface of the light source unit 10 and a portion covering the lateral surface(s) of the light source unit 10.

The quantity of light guide members 20 included in the light-emitting module 100 may be one or plural. In the present embodiment, the light-emitting module 100 includes the plurality of light guide members 20 including a first light guide portion 20A, a second light guide portion 20B, a third light guide portion 20C, and a fourth light guide portion 20D. As illustrated in FIG. 1, in the X direction, the first light guide portion 20A and the second light guide portion 20B are adjacent to each other. In the X direction, the third light guide portion 20C and the fourth light guide portion 20D are adjacent to each other. In the Y direction, the first light guide portion 20A and the third light guide portion 20C are adjacent to each other. In the Y direction, the second light guide portion 20B and the fourth light guide portion 20D are adjacent to each other. The first light source 10A is disposed in the housing portion 20H of the first light guide portion 20A. The second light source 10B is disposed in the housing portion 20H of the second light guide portion 20B. The third light source 10C is disposed in the housing portion 20H of the third light guide portion 20C. The fourth light source 10D is disposed in the housing portion 20H of the fourth light guide portion 20D.

The light guide members 20 are partitioned by partition groove 20G. One region partitioned by the partition groove 20G is referred to as a light-emitting region 300A. In the present embodiment, the first light guide portion 20A, the second light guide portion 20B, the third light guide portion 20C, and the fourth light guide portion 20D partitioned by the partition groove 20G are individual light-emitting regions 300A. One light-emitting region 300A can be used as a driving unit for local dimming. The quantity of light-emitting regions 300A constituting the planar light source 300 is not particularly limited. For example, the planar light source 300 may include one light-emitting region 300A or a plurality of light-emitting regions 300A. A plurality of planar light sources 300 may be arranged to prepare a planar light source device having a larger area. A member having reflectivity to the light emitted by the light source unit 10 may be disposed in the partition groove 20G. This can make it possible to improve a contrast ratio between the light-emitting region in the light-emitting state and the light-emitting region in the non-light-emitting state. In the light-emitting module, a member having reflectivity to the light emitted by the light source unit 10 need not be disposed in the partition groove 20G.

In the present embodiment, the light guide member 20 includes the partition groove 20G having a grid shape and including one or more first partition groove portions 21G extending in the Y direction and one or more second partition groove portions 22G extending in the X direction. Between the first light guide portion 20A and the second light guide portion 20B, there is the first partition groove portion 21G extending in the Y direction. Between the first light guide portion 20A and the third light guide portion 20C, there is the second partition groove portion 22G extending in the X direction. It is preferable that the partition groove 20G extend from the first surface 201 to the second surface 202 of the light guide member 20. In that case, because the light guide member 20 can be separated into a plurality of pieces, for example, the warpage of the support member 200 caused by the difference between thermal expansion coefficients of the light guide member 20 and the support member 200 can be reduced. This can make it possible to decrease the cracking of a conductive member 80 to be described below. The partition groove 20G may be a recessed portion that opens only on the first surface 201 side of the light guide member 20, or may be a recessed portion that opens only on the second surface 202 side of the light guide member 20. When the partition groove 20G is a recessed portion, the partition groove 20G has an upper surface or a bottom surface formed of the light guide member 20.

The light guide member 20 has the first hole portion 21 that opens on the first surface 201 side. In the present embodiment, the first hole portion 21 is a recessed portion that opens only on the side of the first surface 201, which is an upper surface of the light guide member 20. When the first surface 201 constitutes the lower surface of the light guide member 20, the first hole portion 21 may be a recessed portion that opens only on the lower surface side of the light guide member 20. The light guide member 20 having the first hole portion 21 can increase the surface area of the light guide member 20. This can increase the amount of light that is extracted from the surface of the light guide member 20 to the outside of the light guide member 20. Accordingly, the light extraction efficiency of the light-emitting module 100 can be improved. In a plan view, the first hole portion 21 is preferably located apart from the light source unit 10. This can suppress the region directly above the light source unit 10 from becoming too bright.

The light guide member 20 may include one first hole portion 21 or a plurality of first hole portions 21. As illustrated in FIG. 1, in a plan view, the plurality of first hole portions 21 preferably surround the light source unit 10. In that case, light traveling from the light source unit 10 in the lateral direction can be easily extracted to the outside of the light guide member 20 side via the plurality of first hole portions 21. Further, the plurality of first hole portions 21 surrounding the light source unit 10 in a plan view can facilitate existence of a high-luminance portion and a low-luminance portion in a mixed manner in the vicinity of the first hole portions 21. As a result, in a plan view, the boundary between the luminance of a portion located inward of the outer edge of the first hole portion 21 and the luminance of a portion located outward of the outer edge of the first hole portion 21 can be made inconspicuous. Note that in a plan view, one first hole portion 21 may seamlessly surround the light source unit 10.

Figure 4A:
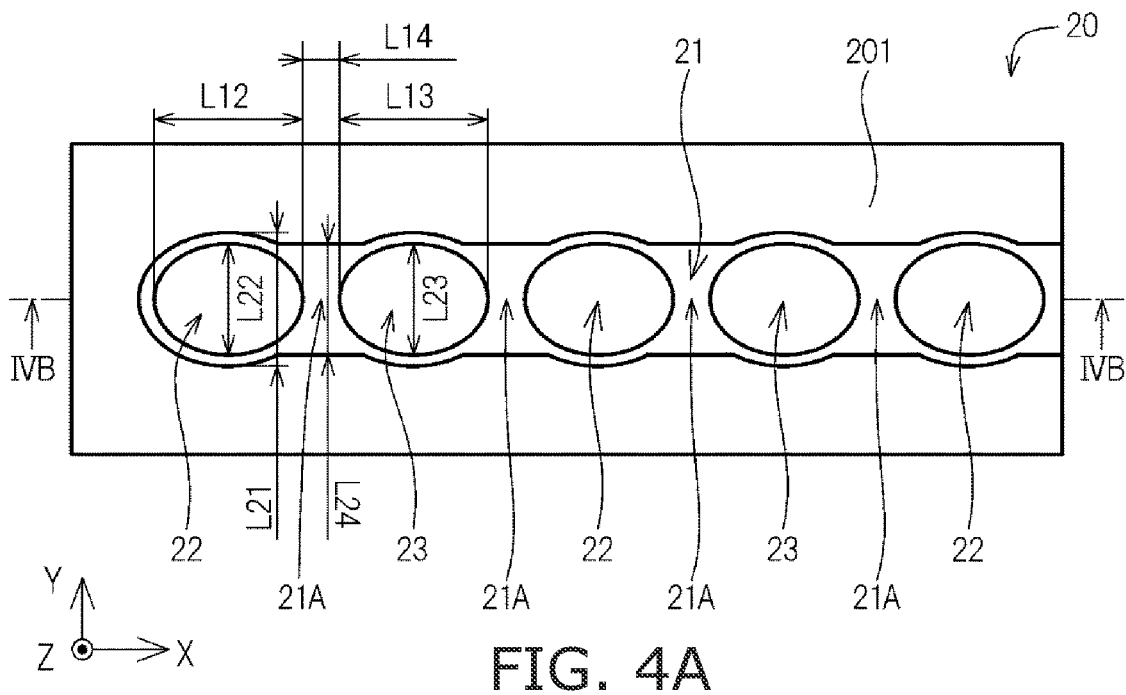
FIG. 4A is an enlarged view of a light guide member in portion IVA in FIG. 1.

A shape of the first hole portion 21 in a plan view is not particularly limited. As illustrated in FIGS. 1 and 4A, the first hole portion 21 of the present embodiment has a linear portion. The first hole portion 21 having a linear portion means, in a plan view, the first hole portion 21 includes a portion in which the length of the first hole portion 21 in the elongated direction of the first hole portion 21 is longer than the length of the first hole portion 21 in the direction orthogonal to the elongated direction of the first hole portion 21. Note that in the present specification, the length of the first hole portion 21 corresponds to a length including the second hole portion 22 and/or the third hole portion 23 located inward of the first hole portion 21. In the present specification, the term linear also includes a straight line, a curved line, a bent line, and the like.

Figure 4B:
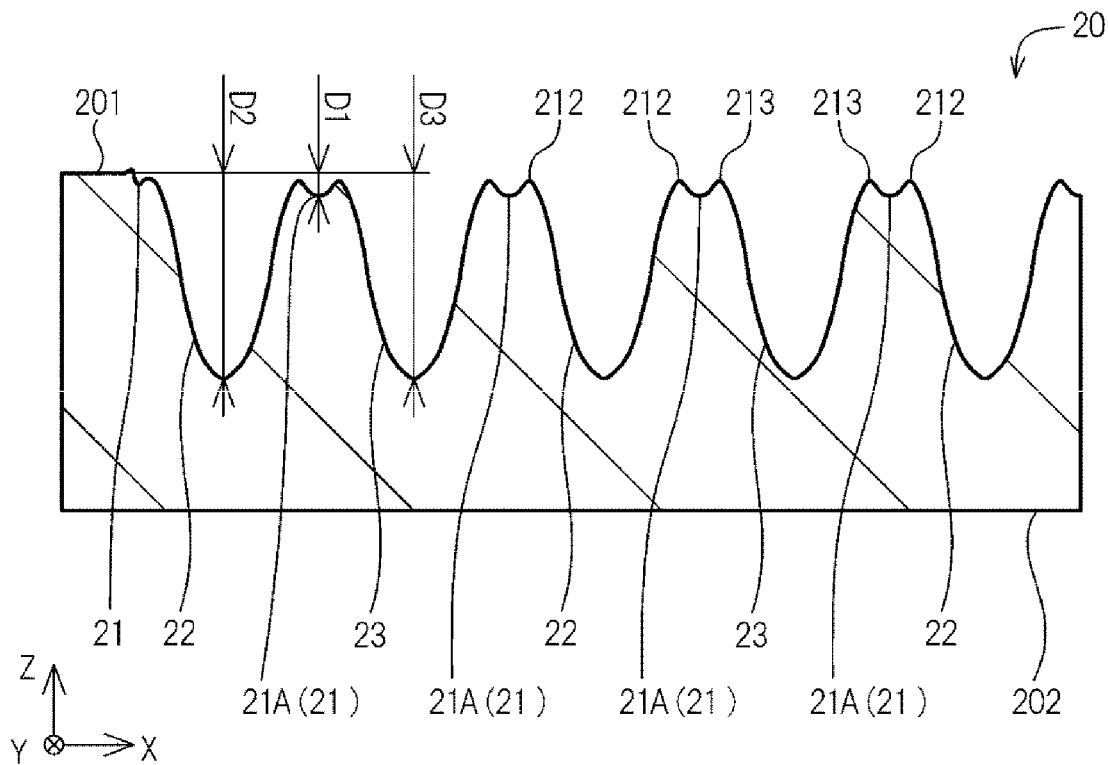
FIG. 4B is a schematic cross-sectional view of the light guide member taken along line IVB-IVB in FIG. 4A.

As illustrated in FIG. 4B, the light guide member 20 includes the second hole portion 22 that opens on the first surface 201 side. In the present embodiment, the second hole portion 22 is a recessed portion that opens only on the first surface 201 side of the light guide member 20. Note that the second hole portion 22 may extend from the first surface 201 to the second surface 202 of the light guide member 20. As illustrated in FIG. 4A, the second hole portion 22 of the light guide member 20 is located inward of the first hole portion 21 in a plan view. Thus, the portion located inward of the outer edge of the second hole portion 22 in a plan view can be suppressed from becoming too bright. Because the second hole portion 22 of the light guide member 20 is located inward of the first hole portion 21 in a plan view, a part of the light traveling from the light source unit 10 toward the second hole portion 22 of the light guide member 20 can be easily extracted from the portion of the light guide member 20 defining the first hole portion 21 continuously surrounding the second hole portion 22. Accordingly, the amount of light that is extracted from the second hole portion 22 can be reduced, and thus the portion located inward of the outer edge of the second hole portion 22 in a plan view can be suppressed from becoming too bright. Note that when the light guide member 20 has the plurality of first hole portions 21, it is sufficient that the second hole portion 22 is located inward of at least one of the first hole portions 21. When the light guide member 20 has the plurality of first hole portions 21, it is preferable that the second hole portion 22 be located inward of all of the plurality of first hole portions 21. In that case, the surface area of the light guide member 20 can be easily increased. Accordingly, light from the light source unit 10 incident on the light guide member 20 can be easily extracted to the outside of the light guide member 20.

The shape of the second hole portion 22 in a plan view is not particularly limited. In the present embodiment, the second hole portion 22 has an elliptical shape in a plan view. In a plan view, the second hole portion 22 may be a circle or may have a polygonal shape such as a triangle, a quadrangle, a hexagon, or an octagon. In addition, the shape of the second hole portion 22 in a plan view may include a linear portion as in the first hole portion 21.

A depth D1 (hereinafter also referred to as a first depth) of the first hole portion 21 from the first surface 201 is preferably shallower than a depth D2 (hereinafter also referred to as a second depth) of the second hole portion 22 from the first surface 201. Light from the light source unit 10 can be more easily extracted when the depth of the hole portion 20R from the first surface 201 is deeper. Thus, in a plan view, the luminance of the portion located between the outer edge of the first hole portion 21 and the outer edge of the second hole portion 22 tends to be lower than the luminance of the portion located inward of the outer edge of the second hole portion 22. Also, in a plan view, the luminance of the portion located between the outer edge of the first hole portion 21 and the outer edge of the second hole portion 22 tends to be higher than the luminance of the portion where the hole portion 20R is not located, that is, the portion outward of the outer edge of the first hole portion 21. Because the second hole portion 22 is located inward of the first hole portion 21 in a plan view and the first depth D1 is shallower than the second depth D2, in a plan view, the luminance can increase from the portion where the hole portion 20R is not located to the second hole portion 22. As a result, the boundary between the luminance of the portion located inward of the outer edge of the second hole portion 22 and the luminance of a portion located outward of the outer edge of the second hole portion 22 can be made inconspicuous. In the present specification, unless otherwise specified, the depth of each hole portion is a value measured in the vertical direction at the maximum distance from the first surface 201 to the portion of the light guide member 20 defining the hole portion. For example, the depth D1 of the first hole portion 21 is a value measured in the vertical direction at the maximum distance from the first surface 201 to the portion of the light guide member 20 defining the first hole portion 21.

As illustrated in FIG. 4B, the light guide member 20 has the third hole portion 23 that opens on the first surface 201 side. In the present embodiment, the third hole portion 23 is a recessed portion that opens only on the first surface 201 side of the light guide member 20. Note that the third hole portion 23 may extend from the first surface 201 to the second surface 202 of the light guide member 20. As illustrated in FIG. 4A, the third hole portion 23 of the light guide member 20 is located inward of the first hole portion 21 in a plan view. Thus, the portion inward of the outer edge of the third hole portion 23 in a plan view can be suppressed from becoming too bright. Note that when the light guide member 20 has the plurality of first hole portions 21, it is sufficient that the third hole portion 23 is located inward of at least one of the first hole portions 21. When the light guide member 20 has the plurality of first hole portions 21, it is preferable that the third hole portion 23 be located inward of all of the plurality of first hole portions 21. In that case, the surface area of the light guide member 20 can be easily increased.

The shape of the third hole portion 23 in a plan view is not particularly limited as in the case of the second hole portion 22. In the present embodiment, the third hole portion 23 has an elliptical shape in a plan view. The shape of the third hole portion 23 in a plan view is preferably substantially the same as the shape of the second hole portion 22 in a plan view. This can make it easy to form the second hole portion 22 and the third hole portion 23. For example, when the second hole portion 22 and the third hole portion 23 are formed by laser processing, the second hole portion 22 and the third hole portion 23 can be formed with substantially the same laser output. In the present specification, substantially the same shape includes a tolerance in variance in a range of ±5 Also, the substantially the same laser output includes an output range within ±5% between one laser output and the other laser output.

The depth D2 (second depth) of the second hole portion 22 from the first surface 201 is preferably in a range from 0.9 times to 1.1 times of a depth D3 (third depth) of the third hole portion 23 from the first surface 201. This can make it easy to form the second hole portion 22 and the third hole portion 23. For example, when the second hole portion 22 and the third hole portion 23 are formed by laser processing, the second hole portion 22 and the third hole portion 23 can be formed with substantially the same laser output.

As illustrated in FIG. 2, the third hole portion 23 and the light source unit 10 preferably overlap in the lateral direction. In that case, the light from the light source unit 10 can be easily extracted from the portion of the light guide member 20 defining the third hole portion 23. In a similar manner, the second hole portion 22 and the light source unit 10 preferably overlap in the lateral direction.

The depth D1 (first depth) of the first hole portion 21 from the first surface 201 is preferably in a range from 0.01 times to 0.2 times of the depth D2 (second depth) of the second hole portion 22 from the first surface 201. The first hole portion 21 having the first depth D1 equal to or greater than 0.01 times the second depth D2 can increase the surface area of the light guide member 20. Thus, light from the light source unit 10 incident on the light guide member 20 can be easily extracted to the outside of the light guide member 20. The first hole portion 21 having the first depth D1 equal to or less than 0.2 times the second depth D2 can facilitate spread of the light from the light source unit 10 in the lateral direction. In other words, the first hole portions 21 having the first depth D1 equal to or less than 0.2 times the second depth D2 can reduce the amount of light that is extracted from the portion of the light guide member 20 defining the first hole portion 21. Because the light from the light source unit 10 easily spreads in the lateral direction, the luminance unevenness of the light-emitting module 100 can be easily reduced. In a similar manner, the first depth D1 is preferably in a range from 0.01 times to 0.2 times of the third depth D3.

As illustrated in FIG. 4A, the second hole portion 22 and the third hole portion 23 are aligned in the first direction. A maximum length L12 of the second hole portion 22 in the first direction is preferably longer than a maximum length L22 of the second hole portion 22 in the second direction orthogonal to the first direction. In that case, a part of the light from the light source unit 10 emitted in a direction that intersects the first direction tends to hit the portion of the light guide member 20 defining the second hole portion 22. This can increase the amount of light that is extracted to the outside of the light guide member 20. Note that in FIG. 4A, the first direction is the X direction, and the second direction is the Y direction.

The quantity of the second hole portions 22 located inward of one first hole portion 21 may be one or plural. The quantity of the third hole portions 23 located inward of one first hole portion 21 may be one or plural. In the present embodiment, as illustrated in FIG. 4A, the plurality of second hole portions 22 and the plurality of third hole portions 23 are located inward of one first hole portion 21. As illustrated in FIG. 4A, in the first direction, the second hole portions 22 and the third hole portions 23 are aligned alternately, and the first hole portion 21 is located between the second hole portion 22 and the third hole portion 23. In this manner, the second hole portions 22 and the third hole portions 23 that allow the light from the light source unit 10 to be easily extracted can exist in a mixed manner. Thus, because a high-luminance portion and a low-luminance portion are likely to exist in a mixed manner in the vicinity of the first hole portion 21, the boundary between the luminance of a portion located inward of the outer edge of the first hole portion 21 and the luminance of a portion located outward of the outer edge of the first hole portion 21 can be made inconspicuous.

As illustrated in FIG. 4A, a maximum length L13 of the third hole portion 23 in the first direction is preferably longer than a maximum length L23 of the third hole portion 23 in the second direction. In that case, a part of the light traveling from the light source unit 10 in a direction that intersects the first direction tends to hit the portion of the light guide member 20 defining the third hole portion 23. Thus, it is possible to increase the amount of light that is extracted from the portion of the light guide member 20 defining the third hole portion 23 to the outside of the light guide member 20.

As illustrated in FIG. 1, in a plan view, an imaginary line IL connecting the center of the light source unit 10 and the outer edge of the light guide member 20 intersects the first direction. That is, the imaginary line IL connecting the center of the light source unit 10 and the outer edge of the light guide member 20 in a plan view along which light from the light source unit 10 tends to travel in the lateral direction intersects the first direction with the long length of the second hole portion 22. Thus, the light that travels in the lateral direction from the light source unit 10 can easily hit the portion of the light guide member 20 defining the second hole portion 22. This can increase the amount of light that is extracted from the portion of the light guide member 20 defining the second hole portion 22. In the present specification, the center of the light source unit means the geometric centroid of the light source unit in a plan view. The imaginary line IL is a line connecting the center of the light source unit and a discretionary point on the outer edge of the light guide member, and a plurality of imaginary lines may be drawn. In the present embodiment, imaginary lines can be drawn in all of the circumferential directions (0° to 360°) from the center of the light source unit. In addition, the imaginary line IL is a line segment with the center of the light source unit 10 and a point on the outer edge of the light guide member 20 as the two ends.

In a plan view, an angle formed by the imaginary line IL connecting the center of the light source unit 10 and the outer edge of the light guide member 20 and the first direction is preferably 30° or greater and more preferably 60° or greater. In that case, the light that travels in the lateral direction from the light source unit 10 can easily hit the portion of the light guide member 20 defining the second hole portion 22. Note that in the present specification, the angle formed by the imaginary line IL and the first direction means 90° or less of angle formed by the imaginary line IL and the first direction.

In a plan view, the imaginary line IL connecting the center of the light source unit 10 and the outer edge of the light guide member 20 is preferably orthogonal to the first direction. In that case, the light that travels in the lateral direction from the light source unit 10 can easily hit the surface of the light guide member 20 defining the second hole portion 22. Thus, it is possible to increase the amount of light that is extracted from the portion of the light guide member 20 defining the second hole portion 22 to the outside of the light guide member 20.

In the present specification, a point farthest from the center of the first light source 10A while being located on an outer edge of the first light guide portion 20A on the first surface 201 is referred to as a first point P1, and a point closest to the center of the first light source 10A while being located on the outer edge of the first light guide portion 20A on the first surface 201 is referred to as a second point P2. In the present embodiment, the first point P1 is located at the corner of the first light guide portion and the second point P2 is located at the center of each side of the first light guide portion 20A. The quantity of the first points P1 and the second points P2 may each be one or plural.

As illustrated in FIG. 1, in a plan view, at least one of the first hole portions 21 is preferably located on an imaginary line segment connecting the center of the first light source 10A and the first point P1. In that case, luminance unevenness in the light-emitting module is reduced. The first point P1 farther from the first light source 10A is more likely to have a lower luminance than the second point P2 closer to the first light source 10A, but the first hole portion 21 located on the imaginary line segment can facilitate an increase in the amount of light that is extracted to the outside of the light guide member 20 in the vicinity of the first point Pb. As a result, the difference between luminance at the first point P1 and luminance at the second point P2 can be reduced, so that luminance unevenness in the light-emitting module is reduced.

The plurality of first hole portions 21 are preferably located on the imaginary line segment connecting the center of the first light source 10A and the first point P1. In that case, it becomes easy to adjust luminance in the vicinity of the first point P1, so that it is easy to reduce luminance unevenness in the light-emitting module. The quantity of the first hole portions 21 located on the imaginary line segment connecting the center of the first light source 10A and the first point P1 is preferably more than the quantity of the first hole portions 21 located on the imaginary line segment connecting the center of the first light source 10A and the second point P2. As a result, the difference between luminance at the first point P1 and luminance at the second point P2 can be easily reduced. Note that it is not necessary to provide the first hole portion 21 located on the imaginary line segment connecting the center of the first light source 10A and the second point P2.

As illustrated in FIG. 4A, a portion 21A where the depth of the first hole portion 21 from the first surface 201 is the maximum is preferably located between the second hole portion 22 and the third hole portion 23 in a plan view. In other words, the portion 21A where the depth of the first hole portion 21 from the first surface 201 is the maximum is preferably located in a region located between the second hole portion 22 and the third hole portion 23 in a plan view. This can easily reduce luminance unevenness in the light-emitting module 100. The second hole portion 22 and the third hole portion 23 have deeper depths than the first hole portion 21, and thus allow the light from the light source unit 10 to be easily extracted. Because the portion 21A where the depth of the first hole portion 21 from the first surface 201 is the maximum is located between the second hole portion 22 and the third hole portion 23 in a plan view, the luminance between the second hole portion 22 and the third hole portion 23 in a plan view can be improved. Accordingly, the difference between the luminance inward of the outer edge of the second hole portion 22 and inward of the outer edge of the third hole portion 23 in a plan view and the luminance in the region between the second hole portion 22 and the third hole portion 23 can be reduced. This can easily reduce luminance unevenness in the light-emitting module 100.

As illustrated in FIG. 4A, the maximum length L12 of the second hole portion 22 in the first direction (X direction) is preferably longer than a minimum distance L14 from the second hole portion 22 to the third hole portion 23 in the first direction (X direction). In that case, the second hole portion 22 with a deeper depth than the first hole portion 21 can be increased in size. This can increase the amount of light that is extracted from the portion of the light guide member 20 defining the second hole portion 22 to the outside of the light guide member 20.

As illustrated in FIG. 4A, a maximum length L21, in the second direction (Y direction), of the first hole portion 21 at a position overlapping with the second hole portion 22 is preferably longer than a maximum length L24 of the first hole portion 21 at a position between the second hole portion 22 and the third hole portion 23 and being apart from the second hole portion 22 and the third hole portion 23. Because the maximum length L21 of the first hole portion 21 in the second direction is long, the distance from the outer edge of the second hole portion 22 to the outer edge of the first hole portion 21 in the second direction can easily be long. This can make it easy to increase the amount of light that is extracted from the portion of the light guide member 20 defining the first hole portion 21 and located between the outer edge of the second hole portion 22 and the outer edge of the first hole portion 21 in the second direction, to the outside of the light guide member 20. This can reduce the difference between the luminance inward of the outer edge of the second hole portion 22 and the luminance of the portion located between the outer edge of the second hole portion 22 and the outer edge of the first hole portion 21 in the second direction in a plan view. Accordingly, luminance unevenness in the light-emitting module 100 can be reduces.

As illustrated in FIG. 4B, in the light guide member 20, a protrusion portion 212 (hereinafter also referred to as a first protrusion portion) that extends in the upward direction is preferably located at a portion connecting the first hole portion 21 and the second hole portion 22. A portion of the surface of the light guide member 20 defining the first hole portion 21 and a portion of the surface of the light guide member 20 defining the second hole portion 22 define the surface of the first protrusion portion 212. Because the light guide member 20 includes the first protrusion portion 212, luminance can be easily adjusted. For example, by changing the size or position of the first protrusion portion 212, the light from the light source unit 10 extracted from the light guide member 20 can be adjusted. In the present embodiment, the first protrusion portion 212 is provided continuously around the second hole portion 22 in a plan view. In addition, the boundary between the first hole portion 21 and the second hole portion 22 in the present embodiment is a point located on the uppermost portion of the first protrusion portion 212 in a cross-sectional view. The point located on the uppermost portion of the first protrusion portion 212 is preferably located lower than the first surface 201. This can make it easier to downsize the light-emitting module 100 in the vertical direction. As illustrated in FIG. 4B, in the light guide member 20, a protrusion portion 213 (hereinafter also referred to as a second protrusion portion) that extends in the upward direction is preferably located at a portion connecting the first hole portion 21 and the third hole portion 23. Because the light guide member 20 includes the second protrusion portion 213, luminance can be easily adjusted.

As illustrated in FIG. 4B, the portion 21A where the depth of the first hole portion 21 from the first surface 201 is the maximum is preferably located between the first protrusion portion 212 and the second protrusion portion 213 in the lateral direction. In that case, the portion 21A where the depth of the first hole portion 21 is the maximum is located between the second hole portion 22 and the third hole portion 23. Accordingly, the difference between the luminance inward of the outer edge of the second hole portion 22 and inward of the outer edge of the third hole portion 23 and the luminance in the region between the second hole portion 22 and the third hole portion 23 can be reduced in a plan view.

A material similar to that of the resin member of the covering member 14 can be used as the material of the light guide member 20. Glass or the like may be used as the material of the light guide member 20. The light guide member 20 may contain a phosphor or light-scattering particles.

The thickness of the light guide member 20 is preferably in a range from 150 µm to 800 µm, for example. In the present specification, unless otherwise specified, the thickness of each member is a value measured in the vertical direction at the maximum distance from the upper surface to the lower surface of the member of each member. The light guide member 20 may be constituted by a single layer or may be constituted by a layered body of a plurality of layers in the vertical direction. When the light guide member 20 is constituted by a layered body, a light-transmissive adhesive may be disposed between layers. The layers of the layered body may include different kinds of main materials. The first depth D1 is preferably in a range from 1 µm to 30 µm, for example. The second depth D2 and the third depth D3 are preferably in a range from 50 µm to 700 µm, for example.

The shape and/or the quantity of the hole portions 20R provided in the first light guide portion 20A may be the same as or different from the shape and/or the quantity of the hole portions 20R provided in the second light guide portion 20B. For example, before the hole portions 20R are formed in the light guide member 20, luminance unevenness in the first light guide portion 20A and luminance unevenness in the second light guide portion 20B are confirmed. After the luminance unevenness in the first light guide portion 20A and the luminance unevenness in the second light guide portion 20B are confirmed, the hole portions 20R respectively suitable for the first light guide portion 20A and the second light guide portion 20B are formed in the light guide member 20. Thus, it is possible to reduce luminance unevenness in the light-emitting module 100. For example, when the luminance unevenness is suppressed to a desired extent before the hole portions 20R are formed in the light guide member 20, no hole portions 20R may be provided in the light guide member 20. To confirm the luminance unevenness in the first light guide portion 20A and the luminance unevenness in the second light guide portion 20B, for example, the luminance can be measured with a two-dimensional color luminance meter (CA-2500 manufactured by Konica Minolta).

A method of forming the hole portions in the light guide member 20 is not particularly limited. For example, the hole portions 20R can be formed in the light guide member 20 by laser processing. The hole portions 20R that open on the first surface 201 side can be formed in the light guide member 20 by heat from laser irradiation. When the hole portions are formed in the light guide member 20 by laser processing, a pulse laser beam is preferably used. By scanning with a pulse laser beam in the first direction, the second hole portion 22 and the third hole portion 23 that are aligned in the first direction and have a deep depth can be easily formed. Note that the light guide member having the hole portions 20R may be formed by a method such as injection molding, transfer molding, compression molding, or a similar method using a mold or the like.

Light-Transmissive Member 30

As illustrated in FIG. 2, the light-emitting module 100 includes a light-transmissive member 30. The light-transmissive member 30 is a member that has light transmissivity to the light emitted by the light source unit 10. The light-transmissive member 30 includes a first transmissive portion 31 and a second transmissive portion 32. In the present embodiment, the first transmissive portion 31 and the second transmissive portion 32 are individual portions. The first transmissive portion 31 and the second transmissive portion 32 may be monolithically formed of the same material. A transmittance of each of the first transmissive portion 31 and the second transmissive portion 32 with respect to a peak wavelength of the light source unit 10 is preferably, for example, 60% or greater, and more preferably 80% or greater. Note that the light-emitting module 100 need not include the light-transmissive member 30.

As illustrated in FIG. 2, the first transmissive portion 31 is preferably in contact with the lateral surface of the light source unit 10. In that case, the light from the light source unit 10 is likely to enter the first transmissive portion 31. The first transmissive portion 31 is preferably in contact with the light guide member 20. In that case, the light from the light source unit 10 is likely to enter the light guide member 20. When the light-emitting module 100 does not include the light-transmissive member 30, the light guide member 20 may be in contact with the lateral surface of the light source unit 10. In that case, the light from the light source unit 10 is likely to enter the light guide member 20.

It is preferable that the first transmissive portion 31 be disposed exposing at least a part of the upper surface of the light source unit 10. In that case, it becomes easier to downsize the light-emitting module 100 in the vertical direction than when the first transmissive portion 31 covers the entire upper surface of the light source unit 10. The first transmissive portion 31 may be disposed exposing the entire upper surface of the light source unit 10. The first transmissive portion 31 may cover the entire upper surface of the light source unit 10. The first transmissive portion 31 covers the entire upper surface of the light source unit 10, thereby facilitating adjustment of luminance in a region directly above the light source unit 10. For example, by changing the thickness of a portion of the first transmissive portion 31 covering the upper surface of the light source unit 10, the luminance in the region directly above the light source unit 10 can be adjusted. This can make it easy to adjust luminance, to thereby tend to reduce luminance unevenness in the light-emitting module 100. When the first transmissive portion 31 covers the upper surface of the light source unit 10, the second transmissive portion 32 covers the upper surface of the light source unit 10 with the first transmissive portion 31 interposed therebetween.

The first transmissive portion 31 may be formed of a single layer or may be formed of a layered body of a plurality of layers in the vertical direction. The first transmissive portion 31 may contain a phosphor or light-scattering particles. When the first transmissive portion 31 is a layered body, one or more layers may contain or need not contain a phosphor and/or light-scattering particles. For example, the first transmissive portion 31 may be formed of one or more layers containing at least one phosphor and one or more layers that do not contain at least one phosphor. A material similar to that of the resin member of the covering member 14 can be used as the material of the first transmissive portion 31, for example.

The second transmissive portion 32 is located above the light source unit 10. The second transmissive portion 32 is located above the first transmissive portion 31. The second transmissive portion 32 is preferably in contact with the upper surface of the light source unit 10 and/or the upper surface of the first transmissive portion 31. This can make it easier to downsize the light-emitting module 100 in the vertical direction.

A material similar to that of the resin member of the covering member 14 can be used as the material of the second transmissive portion 32, for example. Examples of the second transmissive portion 32 that may be used include an optically clear adhesive (OCA) having a sheet shape. The second transmissive portion 32 may contain a phosphor or light-scattering particles.

Light Adjustment Member 40

A light adjustment member 40 has reflectivity and light transmissivity to the light emitted by the light source unit 10. A part of the light emitted from the light source unit 10 is reflected by the light adjustment member 40, and the other part is transmitted through the light adjustment member 40. The transmittance of the light adjustment member 40 with respect to the peak wavelength of the light source unit 10 is lower than the transmittance of the light guide member 20 with respect to the peak wavelength of the light source unit 10. For example, the transmittance of the light adjustment member 15 with respect to a peak wavelength of the light source unit 10 is, preferably in a range from 1% to 50%, more preferably in a range from 3% to 30%, for example. The light adjustment member 40 may be constituted by a single layer or may be constituted by a layered body of a plurality of layers.

The light adjustment member 40 is disposed above the light source unit 10. The light adjustment member 40 and the light source unit 10 overlap in a plan view, and, at the overlapped portion, the light adjustment member 40 is located above the light source unit 10. Because the light adjustment member 40 is located above the light source unit 10, the region directly above the light source unit 10 can be suppressed from becoming too bright.

The light adjustment member 40 is disposed above the first transmissive portion 31. The light adjustment member 40 and the first transmissive portion 31 overlap in a plan view, and, at the overlapped portion, the light adjustment member 40 is located above the first transmissive portion 31. Because the light adjustment member 40 is located above the first transmissive portion 31, it is possible to suppress a region directly above the first transmissive portion 31 from becoming too bright.

The light adjustment member 40 is disposed above the second transmissive portion 32. The light adjustment member 40 and the second transmissive portion 32 overlap in a plan view, and, at the overlapped portion, the light adjustment member 40 is located above the second transmissive portion 32. Because the light adjustment member 40 is located above the second transmissive portion 32, a region directly above the second transmissive portion 32 can be suppressed from becoming too bright.

As illustrated in FIG. 1, in a plan view, at least a part of the outer edge of the light adjustment member 40 is preferably located outward of the outer edge of the housing portion 20H. Accordingly, the vicinity of the outer edge of the housing portion 20H can be suppressed from becoming too bright. In a plan view, the entire outer edge of the light adjustment member 40 may be located outward of the outer edge of the housing portion 20H. Accordingly, the vicinity of the outer edge of the housing portion 20H can be suppressed from becoming too bright. Also, in a plan view, the entire outer edge of the light adjustment member 40 may be located inward of the outer edge of the housing portion 20H. In that case, in a plan view, it becomes easy to increase the area of the light-transmissive member 30 exposed from the light adjustment member 40. Thus, it is possible to increase the amount of light that is extracted to the outside of the light-transmissive member 30 from the light-transmissive member 30.

The light adjustment member 40 includes a light adjustment through hole 40A. Because the light adjustment member 40 has the light adjustment through hole 40A, luminance in a region directly above the light adjustment member 40 is easily adjusted. For example, by changing the size and position of the light adjustment through hole 40A, the light from the light source unit 10 blocked by the light adjustment member 40 can be adjusted. This can make it easy to adjust the luminance in the region directly above the light adjustment member 40, to thereby tend to reduce luminance unevenness in the light-emitting module 100. In a plan view, the light adjustment through hole 40A is located apart from the outer edge of the light adjustment member 40.

The light adjustment through hole 40A of the light adjustment member 40 is preferably located apart from the light source unit 10 in a plan view. Accordingly, the region directly above the light source unit 10 can be suppressed from becoming too bright. When the light adjustment member 40 has a plurality of the light adjustment through holes 40A, all of the light adjustment through holes 40A are preferably located apart from the light source unit 10 in a plan view. Accordingly, the region directly above the light source unit 10 can be suppressed from becoming too bright. Note that when the light adjustment member 40 has the plurality of light adjustment through holes 40A, at least one of the light adjustment through holes 40A of the light adjustment member 40 may overlap the light source unit 10 in a plan view.

In a plan view, the shape of the light adjustment through hole 40A is not particularly limited. As illustrated in FIG. 1, the shape of the light adjustment through hole 40A in a plan view is circular. In a plan view, the shape of the light adjustment through hole 40A may be an ellipse or a polygon such as a triangle, a quadrangle, a hexagon, or an octagon. In a plan view, the shape of the light adjustment through hole 40A may include a linear portion. In the present specification, the term linear also includes a straight line, a curved line, a bent line, and the like. For example, in a plan view, the shape of the light adjustment through hole 40A may include a portion with a V-shape or an L-shape that extends in two directions.

In a plan view, the light adjustment through hole 40A preferably surrounds the light source unit 10. This can make it easier to adjust the luminance of the light-emitting module 100 in the X direction and/or the Y direction. In a plan view, the light source unit 10 is preferably surrounded by the plurality of light adjustment through holes 40A. In that case, a high-luminance portion and a low-luminance portion are likely to exist in a mixed manner in the vicinity of the light adjustment through hole 40A. As a result, the boundary between the luminance of a portion located inward of the outer edge of the light adjustment through hole 40A and the luminance of a portion located outward of the outer edge of the light adjustment through hole 40A can be made inconspicuous. Note that in a plan view, the light adjustment through hole 40A may seamlessly surround the light source unit 10.

As illustrated in FIG. 1, in a plan view, the light adjustment member 40 preferably has a plurality of recessed portions 40C (hereinafter, referred to as light adjustment recessed portions) recessed in the lateral direction. The light adjustment recessed portions 40C are provided on the outer edge of the light adjustment member 40. The light adjustment member 40 having the light adjustment recessed portions 40C can adjust luminance around the light adjustment member 40. For example, by changing the size and position of the light adjustment recessed portion 40C, the light from the light source unit 10 blocked by the light adjustment member 40 can be adjusted. This can make it easy to adjust the luminance around the light adjustment member 40, to thereby easily reduce luminance unevenness in the light-emitting module 100. Further, the light adjustment member 40 having the plurality of light adjustment recessed portions 40C can allow a high-luminance portion and a low-luminance portion likely to exist in a mixed manner in the vicinity of the outer edge of the light adjustment member 40. As a result, in the vicinity of the outer edge of the light adjustment member 40, the boundary between the luminance of a portion located inward of the outer edge of the light adjustment member 40 and the luminance of a portion located outward of the outer edge of the light adjustment member 40 can be made inconspicuous. The size of the light adjustment recessed portion 40C is not particularly limited. A maximum length of the light adjustment recessed portion 40C in the X direction may be shorter than a maximum length of the light adjustment through hole 40A in the X direction. A maximum length of the light adjustment recessed portion 40C in the Y direction may be shorter than a maximum length of the light adjustment through hole 40A in the Y direction.

The light adjustment member 40 can be formed of a resin member 41A (hereinafter referred to as a light adjustment resin member) and a reflection member 41B (hereinafter referred to as a light adjustment reflection member) contained in the light adjustment resin member 41A. A material the same as or similar to that of the resin member of the covering member 14 can be used as the material of the light adjustment resin member 41A. A material the same as or similar to that of the light-scattering particles of the covering member 14 can be used as the material of the light adjustment reflection member 41B. A gas such as nitrogen or oxygen may be used as the light adjustment reflection member 41B. Further, the light adjustment member 40 may contain both light-scattering particles and a gas.

A refractive index of the light adjustment reflection member 41B is preferably lower than a refractive index of the light adjustment resin member 41A. In that case, a part of the light from the light source unit 10 incident on the light adjustment resin member 41A tends to be totally reflected at an interface between the light adjustment resin member 41A and the light adjustment reflection member 41B. This can make it possible to suppress light from escaping to above the light source unit 10, so that it is possible to suppress the region directly above the light source unit 10 from becoming too bright. In the present specification, the refractive index corresponds to a refractive index with respect to the peak wavelength of the light source unit 10.

When the refractive index of the light adjustment reflection member 41B is lower than the refractive index of the light adjustment resin member 41A, the refractive index of the light adjustment resin member 41A is preferably higher than the refractive index of the base material of the light guide member 20. This can easily increase the difference in refractive index between the light adjustment resin member 41A and the light adjustment reflection member 41B. As a result, a part of light traveling from the light adjustment resin member 41A to the light adjustment reflection member 41B is easily totally reflected at the interface between the light adjustment resin member 41A and the light adjustment reflection member 41B. This can make it possible to suppress light from escaping to above the light source unit 10, so that the region directly above the light source unit 10 can be suppressed from becoming too bright.

Figure 5:
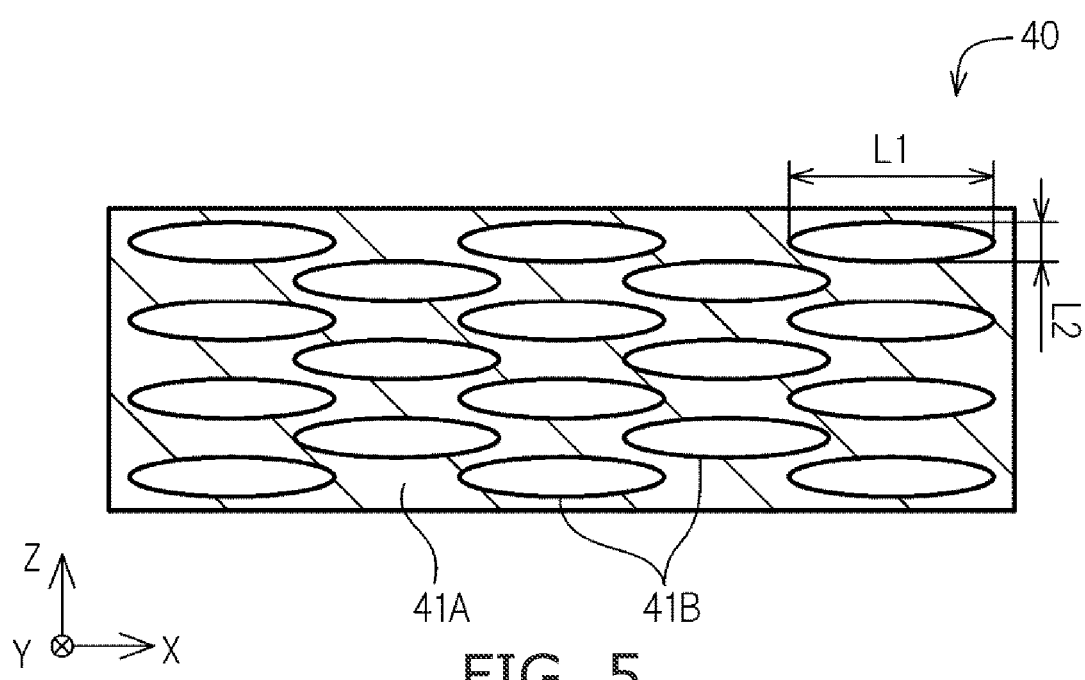
FIG. 5 is a schematic cross-sectional view of a light adjustment member according to the embodiment.

As illustrated in FIG. 5, in a cross-sectional view, the light adjustment reflection member 41B preferably has a maximum length L1 in the lateral direction (i.e., in the direction extending along XY plane) longer than a maximum length L2 in the vertical direction. In that case, the surface of the light adjustment reflection member 41B facing the light source unit 10 can be easily closer to a flat surface than when the light adjustment reflection member 41B is spherical. As a result, when the light emitted from the light source unit 10 is reflected by a part of the light adjustment member 40 located around the light source unit 10 in a plan view, the light is likely to be reflected in a direction away from the light source unit 10. That is, the light emitted from the light source unit 10 can be suppressed from being reflected by a part of the light adjustment member 40 and returning to the light source unit 10. As a result, the light emitted from the light source unit 10 can be suppressed from being absorbed by the light source unit 10, so that the light extraction efficiency of the light-emitting module 100 can be improved. For example, when the light source light-transmissive member 13 of the light source unit 10 contains a phosphor, the light from the light source unit 10 can be suppressed from being excessively subjected to wavelength conversion by the phosphor contained in the light source light-transmissive member 13, because the light emitted from the light source unit 10 can be suppressed from being reflected by the light adjustment member 40 and returning to the light source unit 10. The maximum length L1 of the light adjustment reflection member 41B in the lateral direction (i.e., in the direction extending along XY plane) is not particularly limited. For example, the maximum length L1 of the light adjustment reflection member 41B in the lateral direction is two times or more the maximum length L2 of the light adjustment reflection member 41B in the vertical direction.

Support Member 200

The support member 200 is a member on which the light-emitting module 100 is disposed. The support member 200 supports the light source unit 10 and the light guide member 20. The light guide member 20 is disposed on the support member 200 with the second surface 202 facing an upper surface of the support member 200.

The support member 200 includes a wiring substrate 50. The wiring substrate 50 includes an insulating base body 51, and at least one wiring layer 52 disposed on at least one surface of the insulating base body 51. The insulating base body 51 may be a rigid substrate, or may be a flexible substrate. The insulating base body 51 is preferably a flexible substrate to make the thickness of the planar light source thin. The insulating base body 51 may be formed of a single layer or may be formed of a layered body of a plurality of layers in the vertical direction. For example, the insulating base body 51 may be formed of a single-layer flexible substrate, or may be formed of a layered body of a plurality of rigid substrates. An example of a material of the insulating base body 51 that can be used includes a resin such as a polyimide. The wiring layer 52 is a metal film, for example, a copper film.

The support member 200 further includes a first adhesive layer 61 disposed on the wiring substrate 50, a reflective member 70 disposed on the first adhesive layer 61, and a second adhesive layer 62 disposed on the reflective member 70. The first adhesive layer 61 is disposed between the wiring substrate 50 and the reflective member 70 and bonds the wiring substrate 50 and the reflective member 70. The first adhesive layer 61, for example, can be formed of a resin member containing light-scattering particles. A material similar to that of the resin member of the covering member 14 can be used for the resin member of the first adhesive layer 61, for example. A material similar to that of the light-scattering particles of the covering member 14 can be used for the light-scattering particles of the first adhesive layer 61, for example. Examples of the first adhesive layer 61 that may be used include an optically clear adhesive having a sheet shape.

The refractive index of the resin member of the first adhesive layer 61 is preferably lower than the refractive index of the resin member of the reflective member 70. In that case, a part of light traveling from the reflective member 70 to the first adhesive layer 61 tends to be totally reflected at an interface between the reflective member 70 and the first adhesive layer 61. As a result, light escaping to below the light-emitting module 100 can be reduced, so that the light extraction efficiency of the light-emitting module 100 is improved.

The reflective member 70 is disposed below the light guide member 20, below the light source unit 10, below the light-transmissive member 30, and below the partition groove 20G. The reflective member 70 has reflectivity to the light emitted by the light source unit 10. The reflective member 70 can be formed of a resin member and a reflection member contained in the resin member. A material similar to that of the resin member of the covering member 14 can be used for the resin member of the reflective member 70, for example. A material similar to that of the light-scattering particles of the covering member 14 can be used as the material of the reflection member of the reflective member 70. A gas such as nitrogen or oxygen can be used as the reflection member of the reflective member 70. Further, the reflective member 70 may contain both light-scattering particles and a gas as the reflection member.

The refractive index of the reflection member of the reflective member 70 is preferably lower than the refractive index of the resin member of the reflective member 70. In that case, a part of the light from the light source unit 10 incident on the reflective member 70 tends to be totally reflected at an interface between the resin member of the reflective member 70 and the reflection member of the reflective member 70. This makes it possible to suppress light from escaping downward from the reflective member so that the light extraction efficiency of the light-emitting module 100 is improved.

When the refractive index of the reflection member of the reflective member 70 is lower than the refractive index of the resin member of the reflective member 70, the refractive index of the resin member of the reflective member 70 is preferably higher than the refractive index of the base material of the light guide member 20. In that case, it becomes easy to increase the difference in refractive index between the resin member of the reflective member 70 and the reflection member of the reflective member 70. Accordingly, a part of the light from the light source unit 10 incident on the reflective member 70 tends to be totally reflected at the interface between the resin member of the reflective member 70 and the reflection member of the reflective member 70.

The second adhesive layer 62 is disposed between the reflective member 70 and the second surface 202 of the light guide member 20 and bonds the reflective member 70 and the light guide member 20. The light source unit 10 is disposed over the second adhesive layer 62 in the housing portion 20H of the light guide member 20. The second adhesive layer 62, for example, can be formed of a resin member containing light-scattering particles. A material similar to that of the resin member of the covering member 14 can be used for the resin member of the second adhesive layer 62, for example. A material similar to that of the light-scattering particles of the covering member 14 can be used for the light-scattering particles of the second adhesive layer 62, for example. Examples of the second adhesive layer 62 that may be used include an optically clear adhesive having a sheet shape.

The refractive index of the resin member of the second adhesive layer 62 is preferably lower than the refractive index of the base material of the light guide member 20. In that case, a part of light traveling from the light guide member 20 to the second adhesive layer 62 tends to be totally reflected at an interface between the light guide member 20 and the second adhesive layer 62. As a result, light escaping to below the light-emitting module 100 can be reduced, so that the light extraction efficiency of the light-emitting module 100 is improved. The refractive index of the resin member of the second adhesive layer 62 is preferably lower than the refractive index of the base material of the first transmissive portion 31. In that case, a part of light traveling from the first transmissive portion 31 to the second adhesive layer 62 tends to be totally reflected at an interface between the first transmissive portion 31 and the second adhesive layer 62. As a result, light escaping to below the light-emitting module 100 can be reduced, so that the light extraction efficiency of the light-emitting module 100 is improved.

The support member 200 further includes the conductive member 80. The conductive member 80 is formed of, for example, a resin and metal particles contained in the resin. Examples of the resin of the conductive member 80 that can be used include an epoxy resin and a phenol resin. Examples of metal particles that can be used include copper particles and silver particles.

The conductive member 80 includes a connection portion 81 and a wiring portion 82. The connection portion 81 extends through the second adhesive layer 62, the reflective member 70, the first adhesive layer 61, and the insulating base body 51 in the vertical direction. The wiring portion 82 is disposed on a surface of the wiring substrate 50 on which the wiring layer 52 is disposed, and wiring portion 82 is connected to the connection portion 81. The connection portion 81 and the wiring portion 82 can be monolithically formed of the same material. A portion of the wiring portion 82 is connected to the wiring layer 52.

A pair of conductive members 80 are disposed apart from each other corresponding to the pair of positive and negative electrodes 12 of the light source unit 10. The connection portion 81 of one of the conductive members 80 is connected to the positive electrode 12 below the light source unit 10, and the connection portion 81 of the other conductive member 80 is connected to the negative electrode 12 below the light source unit 10. The electrodes 12 of the light source unit 10 are electrically connected to the conductive members 80 and the wiring layer 52.

The support member 200 further includes an insulating layer 90. The insulating layer 90 is disposed on a lower surface of the wiring substrate 50 and covers the wiring layer 52. Examples of the material of the insulating layer 90 that can be used include an epoxy resin, a urethane resin, and an acrylic resin.

The present specification includes the following embodiments.

Item 1

A light-emitting module including:
a light source unit; and
a light guide member surrounding the light source unit in a plan view and including a first surface and a second surface on an opposite side of the first surface, wherein
the light guide member has a first hole portion opening on a side of the first surface, and a second hole portion and a third hole portion located inward of the first hole portion in a plan view,
the second hole portion and the third hole portion are aligned in a first direction,
a depth of the first hole portion from the first surface is shallower than a depth of the second hole portion and a depth of the third hole portion from the first surface, and
in the plan view, a maximum length of the second hole portion in the first direction is longer than a maximum length of the second hole portion in a second direction orthogonal to the first direction.

Item 2

The light-emitting module according to item 1, wherein a portion where a depth of the first hole portion from the first surface is the maximum is located between the second hole portion and the third hole portion in a plan view.

Item 3

The light-emitting module according to item 1 or 2, wherein the maximum length of the second hole portion in the first direction is longer than a minimum distance from the second hole portion to the third hole portion in the first direction.

Item 4

The light-emitting module according to any one of items 1 to 3, wherein in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion.

Item 5

The light-emitting module according to any one of items 1 to 4, wherein a depth of the second hole portion from the first surface is in a range from 0.9 times to 1.1 times of a depth of the third hole portion from the first surface.

Item 6

The light-emitting module according to any one of items 1 to 5, wherein a depth of the first hole portion from the first surface is in a range from 0.01 times to 0.2 times of a depth of the second hole portion from the first surface.

Item 7

The light-emitting module according to any one of items 1 to 6, wherein the light guide member includes a protrusion portion extending in an upward direction and located at a portion connecting the first hole portion and the second hole portion.

Item 8

The light-emitting module according to any one of items 1 to 7, wherein in the plan view, an imaginary line connecting a center of the light source unit and an outer edge of the light guide member intersects the first direction.

Item 9

The light-emitting module according to any one of items 1 to 8, wherein in the plan view, the imaginary line connecting the center of the light source unit and the outer edge of the light guide member is orthogonal to the first direction.

The embodiments of the present invention have been described above with reference to specific examples. However, the present invention is not limited to these specific examples. All aspects that can be practiced by a person skilled in the art modifying the design as appropriate based on the above-described embodiments of the present invention are also included in the scope of the present invention, as long as they encompass the spirit of the present invention. In addition, in the spirit of the present invention, a person skilled in the art can conceive of various alterations and modifications, and those alterations and modifications will also fall within the scope of the present invention.

What is claimed is:

1. A light-emitting module comprising:
a light source unit; and
a light guide member surrounding the light source unit in a plan view and including a first surface, wherein
the light guide member has a first hole portion opening on a side of the first surface, and a second hole portion and a third hole portion located inward of the first hole portion in a plan view,
the second hole portion and the third hole portion are aligned in a first direction,
a depth of the first hole portion from the first surface is shallower than a depth of the second hole portion from the first surface and a depth of the third hole portion from the first surface,
in the plan view, a maximum length of the second hole portion in the first direction is longer than a maximum length of the second hole portion in a second direction orthogonal to the first direction, and the maximum length of the second hole portion in the first direction is longer than a minimum distance from the second hole portion to the third hole portion in the first direction.

2. The light-emitting module according to claim 1, wherein
a portion where a depth of the first hole portion from the first surface is the maximum is located between the second hole portion and the third hole portion in the plan view.

3. The light-emitting module according to claim 1, wherein
a portion where a depth of the first hole portion from the first surface is the maximum is located between the second hole portion and the third hole portion in the plan view,
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion,
the light guide member includes a protrusion portion extending in an upward direction and located at a portion connecting the first hole portion and the second hole portion, and
in the plan view, an imaginary line connecting a center of the light source unit and an outer edge of the light guide member intersects the first direction.

4. The light-emitting module according to claim 1, wherein
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion.

5. The light-emitting module according to claim 1, wherein
the depth of the second hole portion from the first surface is in a range from 0.9 times to 1.1 times of the depth of the third hole portion from the first surface.

6. The light-emitting module according to claim 1, wherein
the depth of the first hole portion from the first surface is in a range from 0.01 times to 0.2 times of the depth of the second hole portion from the first surface.

7. The light-emitting module according to claim 1, wherein
the light guide member includes a protrusion portion extending in an upward direction and located at a portion connecting the first hole portion and the second hole portion.

8. The light-emitting module according to claim 1, wherein
in the plan view, an imaginary line connecting a center of the light source unit and an outer edge of the light guide member intersects the first direction.

9. The light-emitting module according to claim 1, wherein
in the plan view, an imaginary line connecting a center of the light source unit and an outer edge of the light guide member is orthogonal to the first direction.

10. The light-emitting module according to claim 1, wherein
a portion where a depth of the first hole portion from the first surface is the maximum is located between the second hole portion and the third hole portion in the plan view, and
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion.

11. The light-emitting module according to claim 1, wherein
a portion where a depth of the first hole portion from the first surface is the maximum is located between the second hole portion and the third hole portion in the plan view,
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion, and
the light guide member includes a protrusion portion extending in an upward direction and located at a portion connecting the first hole portion and the second hole portion.

12. The light-emitting module according to claim 1, wherein
a portion where a depth of the first hole portion from the first surface is the maximum is located between the second hole portion and the third hole portion in the plan view,
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion, and
the depth of the second hole portion from the first surface is in a range from 0.9 times to 1.1 times of the depth of the third hole portion from the first surface, and
the light guide member includes a protrusion portion extending in an upward direction and located at a portion connecting the first hole portion and the second hole portion.

13. The light-emitting module according to claim 1, wherein
a portion where a depth of the first hole portion from the first surface is the maximum is located between the second hole portion and the third hole portion in the plan view,
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion,
the depth of the first hole portion from the first surface is in a range from 0.01 times to 0.2 times of the depth of the second hole portion from the first surface, and the light guide member includes a protrusion portion extending in an upward direction and located at a portion connecting the first hole portion and the second hole portion.

14. A light-emitting module comprising:
a light source unit; and
a light guide member surrounding the light source unit in a plan view and including a first surface, wherein
the light guide member has a first hole portion opening on a side of the first surface, and a second hole portion and a third hole portion located inward of the first hole portion in a plan view,
the second hole portion and the third hole portion are aligned in a first direction,
a depth of the first hole portion from the first surface is shallower than a depth of the second hole portion from the first surface and a depth of the third hole portion from the first surface,
in the plan view, a maximum length of the second hole portion in the first direction is longer than a maximum length of the second hole portion in a second direction orthogonal to the first direction, and
in the plan view, a maximum length of the first hole portion in the second direction at a position overlapping with the second hole portion is longer than a maximum length of the first hole portion in the second direction at a position that is located between the second hole portion and the third hole portion and is apart from the second hole portion and the third hole portion.

15. The light-emitting module according to claim 14, wherein
a portion where a depth of the first hole portion from the first surface is the maximum is located between the second hole portion and the third hole portion in the plan view.

16. The light-emitting module according to claim 14, wherein
the depth of the second hole portion from the first surface is in a range from 0.9 times to 1.1 times of the depth of the third hole portion from the first surface.

17. The light-emitting module according to claim 14, wherein
the depth of the first hole portion from the first surface is in a range from 0.01 times to 0.2 times of the depth of the second hole portion from the first surface.

18. The light-emitting module according to claim 14, wherein
the light guide member includes a protrusion portion extending in an upward direction and located at a portion connecting the first hole portion and the second hole portion.

19. The light-emitting module according to claim 14, wherein
in the plan view, an imaginary line connecting a center of the light source unit and an outer edge of the light guide member intersects the first direction.

20. The light-emitting module according to claim 14, wherein
in the plan view, an imaginary line connecting a center of the light source unit and an outer edge of the light guide member is orthogonal to the first direction.

* * * * *